United States Patent [19]
Degani et al.

[11] Patent Number: 5,608,262
[45] Date of Patent: Mar. 4, 1997

[54] PACKAGING MULTI-CHIP MODULES WITHOUT WIRE-BOND INTERCONNECTION

[75] Inventors: Yinon Degani, Highland Park; Thomas D. Dudderar, Chatham; Byung J. Han, Scotch Plains; Alan M. Lyons, New Providence; King L. Tai, Berkeley Heights, all of N.J.

[73] Assignee: Lucent Technologies Inc., Murray Hill, N.J.

[21] Appl. No.: 393,628

[22] Filed: Feb. 24, 1995

[51] Int. Cl.⁶ .................................................. H01L 23/34
[52] U.S. Cl. ........................... 257/723; 257/777; 257/778
[58] Field of Search ............................... 257/723, 778, 257/777

[56] References Cited

U.S. PATENT DOCUMENTS 4,903,120  2/1990  Beene et al. ........................... 257/723

OTHER PUBLICATIONS

F. Motika, Flip–Chip On Personalization Chip Carrier Package Dec. 1980 pp. 2770–2773.
Patent No. 5,346,118, filed on Sep. 28, 1993 and issued on Sep. 13, 1994 to Yinon Degani, Thomas D. Dudderar & William L. Woods, Jr.

"Overmolded Plastic Pad Array Carriers (OMPAC): A Low Cost, High Interconnect Density IC Packaging Solution for Consumer and Industrial Electronics" by Bruce Freyman and Robert Pennisi, which article appeared in 41st Electronic Components and Technology Conference, Book B, No. 502920 Atlanta, GA, pp. 176–182. no date.

"A Mixed solder Grid Array and Peripheral Leaded MCM Package" by Hashemi, H., Olla, M, Cobb, D., and Sandborn, P, Journal: Proc Electron Compon Technol Conf., Orlando, Florida, 1993, pp. 951–956. no month.

*Primary Examiner*—William Mintel
*Assistant Examiner*—Roy Potter
*Attorney, Agent, or Firm*—Oleg E. Alber; Robert E. Rudnick

[57]  ABSTRACT

Described is a novel packaging of MCM tiles without wire-bond interconnections and in a total thickness which is reduced relative to conventional MCM packaging. The MCM tile includes a substrate with a plurality of peripheral metallizations and at least one chip flip-chip mounted on the substrate. The PWB is provided with an aperture which is smaller than the size of the silicon substrate but larger than the outside dimensions of the mounted chips. The substrate is positioned on the PWB so that its ends overlap areas of the PWB adjacent the aperture and the chips fit into the aperture. Peripheral metallizations on the substrate are interconnected to metallizations on the PWB by either solder reflow technology or conductive adhesive technology.

15 Claims, 6 Drawing Sheets

PACKAGING MULTI-CHIP MODULES WITHOUT WIRE-BOND INTERCONNECTION

TECHNICAL FIELD

This invention concerns packaging of semiconductor devices with integrated circuit units to be applied to surface mount assembly.

BACKGROUND OF THE INVENTION

Portable industrial and consumer products tend toward smaller size, lower cost and increased functionality. These requirements place greater emphasis on the development of semiconductor packaging technologies which can accommodate larger, more complex integrated circuits in thinner packages.

Conventional surface mount technology utilizes leaded plastic packages. However, as the pitch and size of the leaded plastic packages keep on being reduced, such problems as poor solder assembly yields, due to poor control of lead coplanarity, and poor fine pitch solder printing yields, due to continuing shrinking of the lead pitch, continue to remain of major importance.

One type of packaging which seemed to overcome these problems is an Overmolded Plastic Pad Array Carrier (OMPAC) technology. OMPAC assembly utilizes a double-sided printed circuit or wiring board laminate. (Hereinafter the printed circuit board or printed wiring board will be referred to as "PWB"). The top side metallization of the PWB is comprised of a die pad for die attachment of an integrated circuit (IC) unit and grounding and wirebond fingers. The IC unit may include a semiconductor chip (a die), or multiple semiconductor chips, or a Multi-Chip Module (MCM) tile including one or more chips and/or some other elements of the device on a commonly shared silicon substrate. The wirebond fingers extend outward to plated through holes (hereinafter referred to as "thruholes") in the PWB located near the edge of the package. The thruholes provide an electrical continuity from the top side to the bottom side of the PWB. The signal path is completed on the bottom side of the PWB by plated copper traces extending from the thruholes to solder pads for solder bump termination. Except for the solder bumps, all metal features on the PWB are typically photodefined, etched and electroplated with copper, nickel and gold. Conventional epoxy die attach and wire bonding technologies are used to interconnect the integrated circuit unit to the PWB. After the die and wire bonding, the PWB is overmolded using conventional epoxy transfer technology. After post-mold curing, the packages are solder bumped and electrically tested. Subsequently these are referred to as "ball grid array" (BGA) packages. Solder bumps are used for further interconnection of the BGA package, for example, to a "mother board". The mother board typically has a much larger area than the OMPAC BGA package, upon which may be arranged a number of other interconnected lumped electrical elements, such as capacitors, transformers, and resistors, which cannot be conveniently integrated into the chips or modules, as well as other packaged IC's, BGAs, plugs and connectors.

The major advantages of OMPAC BGA packages as compared to leaded surface mount packages include increased packaging interconnect density due to an evenly spaced matrix of solder connections on the bottom side of the package, higher solder assembly yields, and no lead coplanarity problems.

Figure 11:
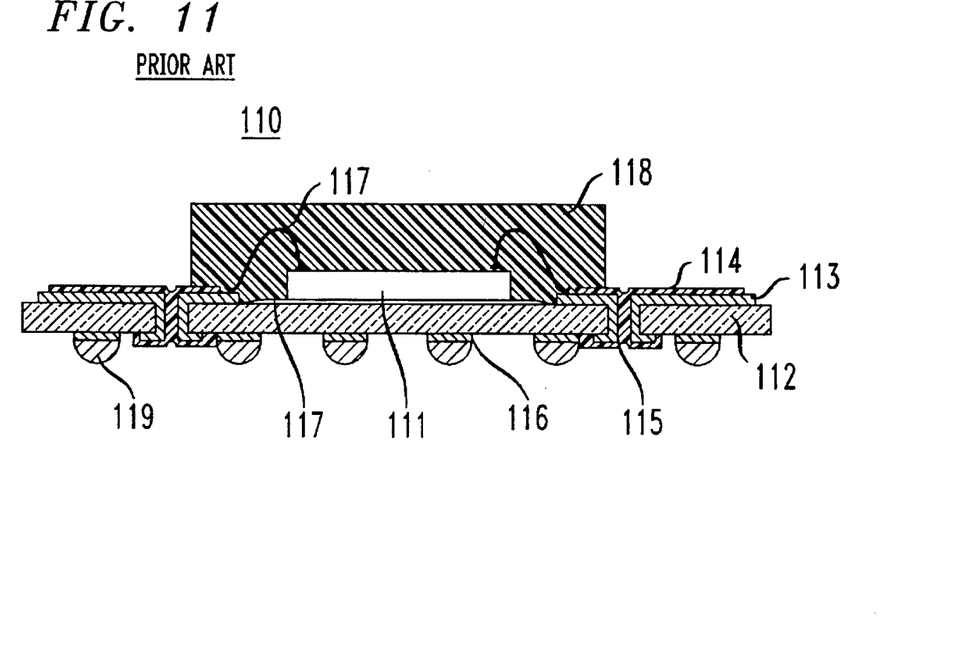
FIG. 11 is a schematic representation in cross-section of a prior-art OMPAC device provided with wire-bond interconnections between a semiconductor die and a PWB.

In FIG. 11 of the drawings is shown a schematic representation in cross-section of a representative prior art OMPAC BGA, 110, with an IC unit, 111, being a single die or chip component. Device 110 includes a PWB, 112, provided with wirebond fingers, 113, a polymer coating which acts as a solder mask, 114, on the fingers, thruholes, 115, contact pads, 116, wires, 117, interconnecting the die to wirebond fingers 113, and a molding compound, 118, enclosing the die, the wires and those portions of wirebond fingers 113 which are bonded to the wires. Contact pads 116 are further provided with solder bumps, 119, for interconnection to a mother board (not shown).

Figure 12:
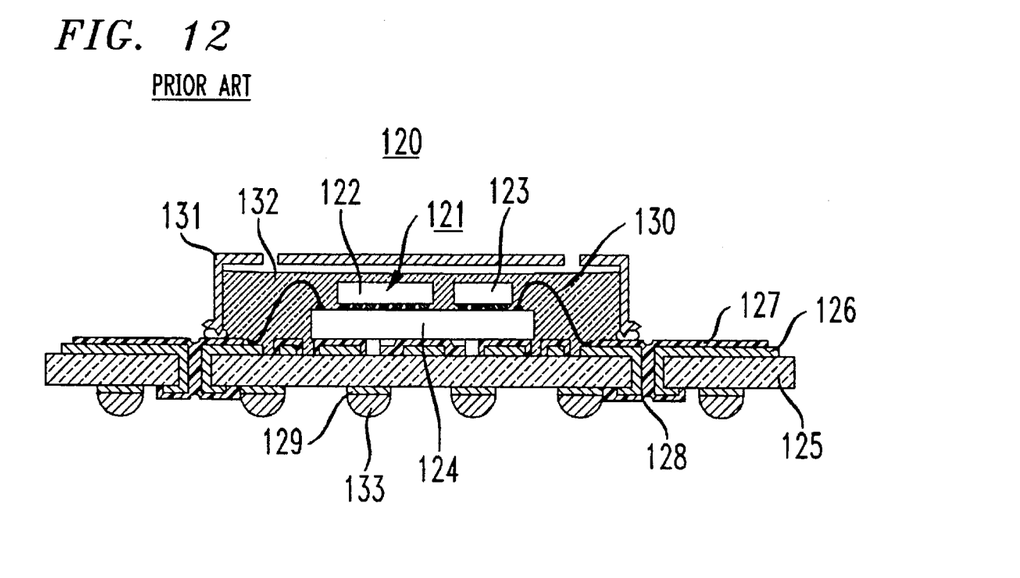
FIG. 12 is a schematic representation in cross-section of a prior art device with a MCM tile wire-bond interconnected to a PWB.

In FIG. 12 of the drawings is shown a schematic representation of another prior art device, 120, a variant of the OMPAC BGA. Here the IC unit is a silicon-on-silicon MultiChip Module (MCM) tile, 121, including a plurality of chips or dies, 122 and 123, flip-chip mounted by means of solder or conductive adhesive reflow technology to interconnection circuitry (not shown) on a silicon interconnection substrate, 124. Silicon substrate 124 is mounted on a PWB, 125, which is provided with wirebond fingers, 126, a solder mask, 127, plated thruholes, 128, and contact pads, 129. The silicon substrate is interconnected by means of wires, 130, to wirebond fingers 126. A protective shell, 131, filled with highly compliant encapsuling material, such as silicone gel, 132, protects the MCM tile and the wirebonds. Contact pads 129 are provided with solder bumps, 133, for interconnection to a mother board (not shown).

In contrast to device 110, device 120 shown in FIG. 12 avoids the molding step, thus avoiding exposure of the assembly to rigors of the molding process. However, device 120 continues the use of wirebond interconnections between the IC unit and the wirebond fingers. Wire bonding is a time-consuming procedure, which becomes more time-consuming as the number of I/O counts per die or MCM tile keeps on increasing. Also, in order to provide viable interconnections, the wirebond fingers on the PWB are gold-over-nickel plated copper. By eliminating the wirebond interconnection, the need for expensive gold-over-nickel plating of copper on the PWB would be eliminated. This would lead to a significant cost reduction. Thus, it is desirable to produce a device without wirebond interconnections. Furthermore, it is desirable to reduce the thickness of the packages.

SUMMARY OF THE INVENTION

This invention embodies a novel packaging of MCM tiles without wirebond interconnections and in a total thickness which is reduced relative to conventional MCM packaging. The MCM tile includes a substrate with a plurality of peripheral metallizations and at least one chip flip-chip mounted on the substrate. The PWB is provided with an aperture which is smaller than the size of the substrate but larger than the outside dimensions of the chips. The substrate is positioned on the PWB so that its ends overlap areas of the PWB adjacent the aperture and the chips fit into the aperture. Peripheral metallizations on the substrate are interconnected to metallizations on the PWB by solder or conductive adhesive technology.

DETAILED DESCRIPTION

Figure 1:
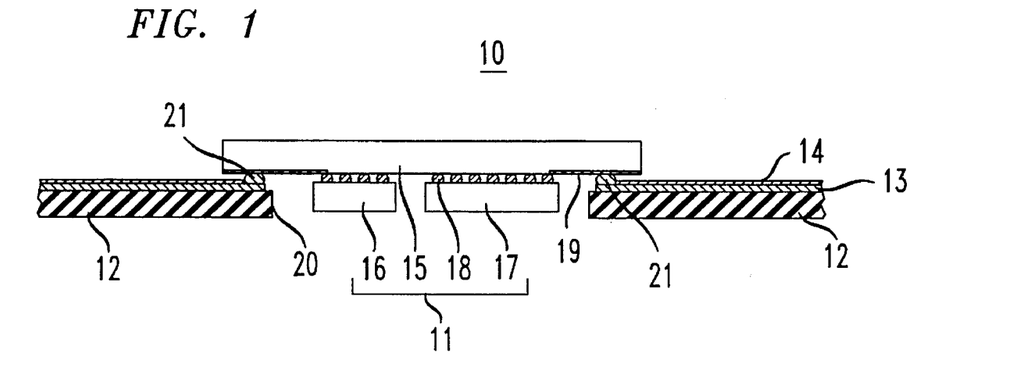
FIG. 1 is a schematic representation in cross-section of a semiconductor device having an MCM tile mounted on a PWB without wirebond interconnection.

In FIG. 1 is shown a schematic representation in cross-section of a device, 10, embodying this invention. Here an MCM tile, 11, is mechanically and electrically interconnected to a PWB, 12. The latter includes printed circuitry, 13. The circuitry is typically copper coated by a polymer mask, 14, except for those areas which are to be used for solder or conductive adhesive interconnection. The resist is to prevent spreading of the solder or conductive adhesive beyond the contact area.

Figure 2:
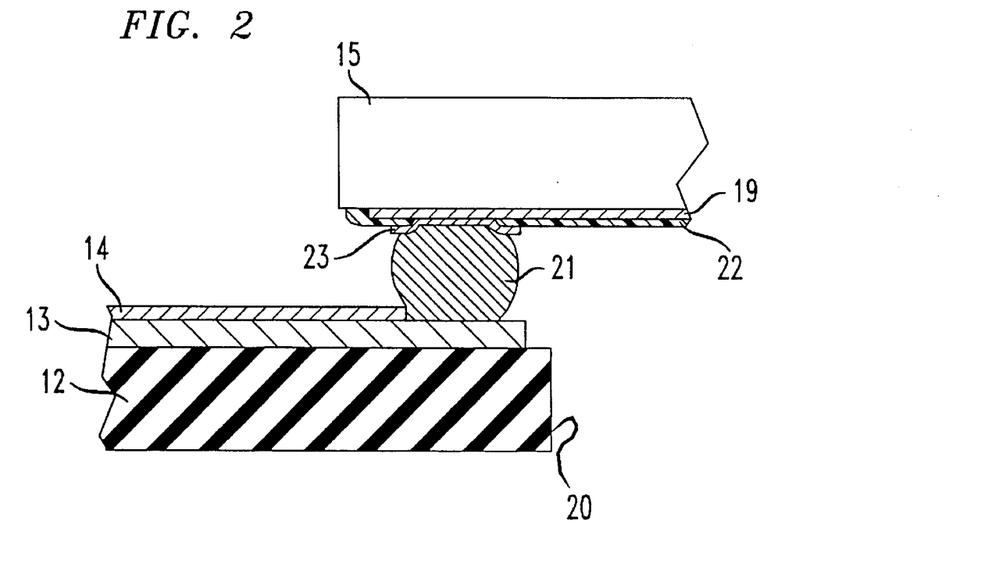
FIG. 2 is a schematic representation of a conductive solder connection between a contact on a silicon MCM tile substrate and a contact pad on the PWB.

In the exemplary embodiment, MCM tile 11 is a silicon-on-silicon structure having a silicon substrate, 15, provided with metallizations to which each chip or die, 16 and 17, is interconnected in a flip-chip manner by means of solder, 18. Alternatively conductive adhesive may be used instead of solder. Also, the substrate may be made of other materials including ceramic and plastic materials. Peripheral metallizations, 19, are provided on I/O pads of the silicon substrate for interconnecting to circuitry 13 on PWB 12. The PWB is provided with a pattern of contact pads which match I/O pads on the silicon substrate of the MCM tile. In order to provide a proper surface for reflow solder, these contact pads are finished with a solder wettable metallization, 23 (FIG.2). For conductive adhesive interconnection such metallizations are not necessary, and essentially any conductive surface will suffice. The solder reflow or conductive adhesive interconnection removes the necessity for wire bond connecting the circuitry on the silicon substrate to the circuitry on the PWB.

The PWB is provided with an aperture, 20. The size of aperture 20 is such that, when MCM tile 11 is electrically and mechanically interconnected to PWB 12, chips 16 and 17 on silicon substrate 15 fit into the aperture without contacting the walls of the aperture. Since only the ends of the silicon MCM tile substrate are in contact with circuitry 13 via reflowed solder interconnections, 21, and the chips are within the aperture, the thickness of the assembly is reduced, at least by the thickness of the chips and interconnections between the chips and the silicon substrate. This compares advantageously to the MCM tile-on-PWB assembly thickness that results when the MCM tile is oriented with the chips up and wire bonded to the PWB circuitry 13 as in the prior art e.g. as shown in FIGS. 11 and 12.

In FIG. 2 is shown a schematic diagram for a solder reflow interconnection attachment between silicon substrate 15 of the MCM tile and PWB 12. Silicon substrate 15 is provided with peripheral metallizations 19 in the form of metallic contact fingers. Except for an area provided with a solder wettable metallization, 23, which is to be contacted by reflowed solder interconnection 21, each of the contact fingers is coated with polymer 22. The PWB includes metallic printed circuitry 13. The latter is also coated with polymer 14 except for a contact area to be contacted with reflowed solder interconnection, 21. Polymer 14 functions as a solder mask to prevent the solder from wetting any of the rest of the circuitry beyond the contact area.

In order to accommodate the use of printed solder as an interconnection medium between the MCM tile and the PWB, pads on wirebond fingers of the prior art silicon MCM tile substrates, e.g. in FIG. 11 or FIG. 12, are replaced by solder wettable base I/O metal pads which are deposited at the same time as the solder wettable metallizations are deposited on the MCM flip-chip pads. In an exemplary embodiment, these solder wettable I/O pads would be configured as 96 μm by 146 μm pads on a 305 μm (12 mil) pitch to facilitate printing with 170 μm by 280 μm solder paste deposits at the same time the solder paste is being printed on the internal I/O pads used to attach the chips to the substrate. This process may be used with an intermediate to high melting point temperature solder, such as 95/5 Sn/Sb, to produce solder-bumped MCM tiles, that is, MCM tiles on which, after whole wafer assembly, cleaning, testing and separation into individual tiles, each output pad on every tile would be furnished with a solder bump. As such they would be suitable for reflow soldering with printed eutectic (or near eutectic) Sn/Pb solder (common to SMT assembly). The addition of solder bumps to the MCM tile I/O pads would also improve testability of the MCM tile prior to its assembly with the PWB and hence would increase yields by reducing the number of good tiles that are rejected due to false readings. A technology for forming solder bumps on metal pads of an element, such as on an IC package or substrate, is disclosed in U.S. Pat. No. 5,346,118 issued Sep. 13, 1994, which is incorporated herein by reference. That technology is useful in manufacturing devices without wire-bond interconnections.

In FIGS. 3 through 9 are shown a few exemplary variants for protecting from the environment the MCM tile and tile-to-PWB interconnections of the assembly shown in FIG. 1. In these figures, the same numerals are being used to denote the same components as are represented in FIGS. 1 and 2. To avoid repetitions not all numerals shown in FIG. 1 are shown in these figures.

Figure 3:
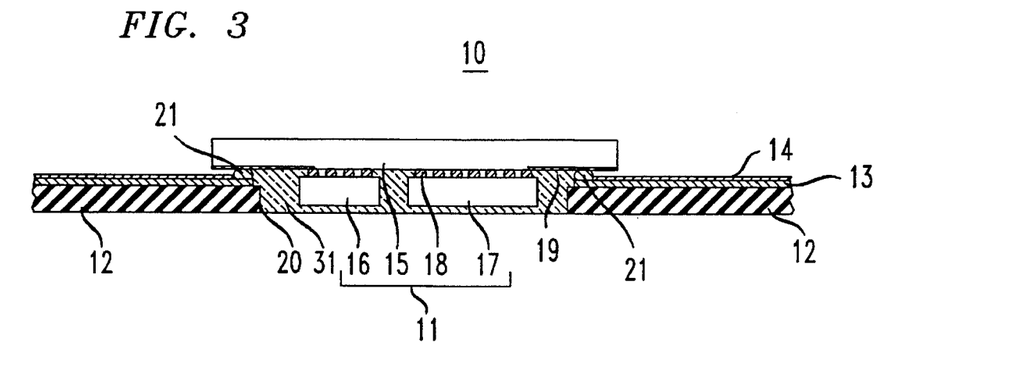
FIG. 3 is a schematic representation in cross-section of the semiconductor device shown in FIG. 1 but in which a cavity in the PWB is filled with a compliant encapsulating material encompassing the chips of the MCM tile.

In FIG. 3 the cavity formed by silicon substrate 15 and the walls of aperture 20 in the PWB is filled with an encapsulating material, 22, such as silicone gel, which protects the chips, interconnections between the chips and the substrate, interconnections between the substrate and the PWB, and surfaces of the substrate exposed within the cavity.

Figure 4:
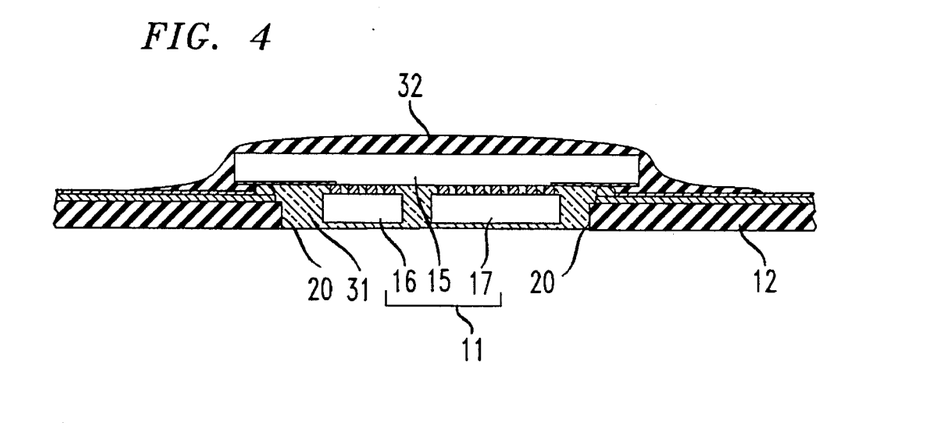
FIG. 4 is a schematic representation in cross-section of the semiconductor device shown in FIG. 1 in which a cavity in the PWB is filled with a compliant encapsulating material encompassing the chips of the MCM, and a glob top encloses outer surfaces of the MCM tile substrate (glob top is an encapsulating, electrically insulating member which is applied in a liquid form and cured in place)

In FIG. 4 the cavity formed by silicon substrate 15 and the walls of aperture 20 in the PWB is filled, similarly to FIG. 3, with an encapsulating material such as a silicone gel, 22 which protects the chips, interconnections and adjacent surfaces of the substrate. However, other surfaces of the substrate are protected by a compliant "glob top", 23.

Figure 5:
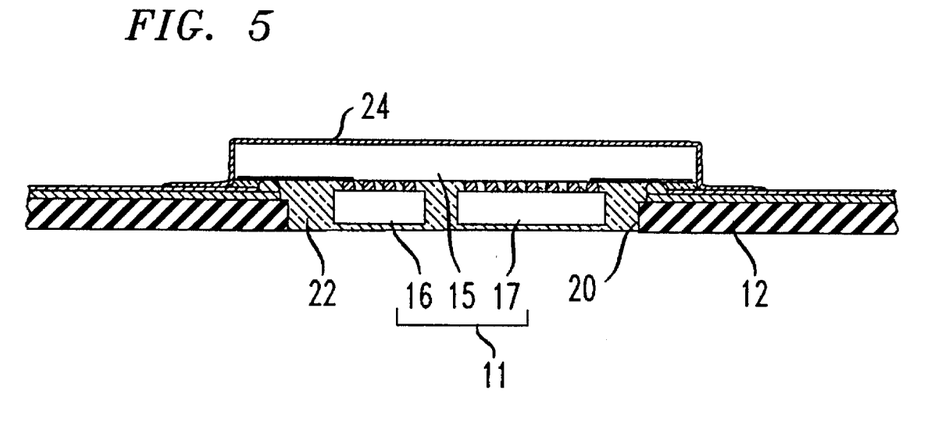
FIG. 5 is a schematic representation in cross-section of the semiconductor device shown in FIG. 1 in which the cavity within the PWB is filled with a compliant encapsulating material encompassing the chips, and a metal foil-coated polymer is positioned about the substrate of the MCM tile.

In FIG. 5, a metallized polymer film, 24, is laminated to the PWB adjacent to silicon substrate 15 and to outer surfaces of the substrate which would otherwise be left exposed. This provides protection without compromising handling the package during testing or assembly, as might a compliant glob top overcoat. It also minimizes the overall package height relative to a package with a glob top. Similarly to FIG. 3, the space formed by silicon substrate 15 and the walls of aperture 20 in the PWB is filled with silicon gel 22.

Figure 6:
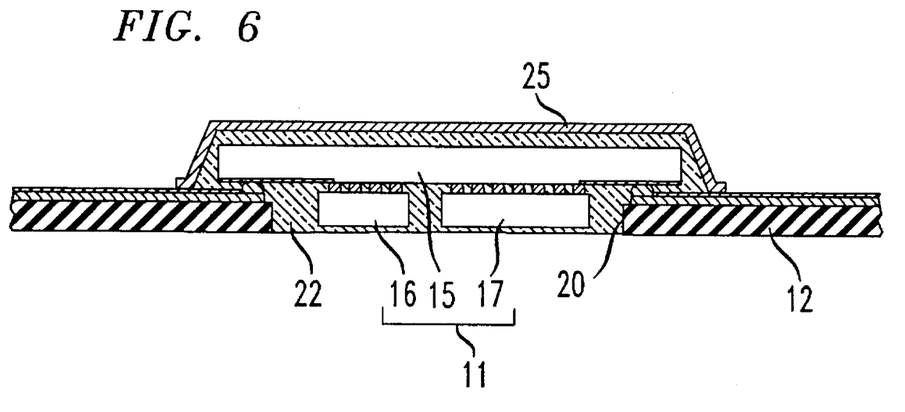
FIG. 6 is a schematic representation in cross-section of the semiconductor device shown in FIG. 1 in which a cup-like cover is placed over the substrate of the MCM tile and the cavity within the cover and the PWB is enclosed with a compliant encapsulating material.

In FIG. 6 cup-like cover, 25, is placed over the upper surface of silicon substrate 15 and adhesively secured to the PWB. Copper as a metal for the cover is advantageous for its thermal-mechanical properties, for protection against electromagnetic radiation, and for its formability, e.g. by stamping. However, the use of other metals or of a molded plastic cup-like cover is not excluded. For example, if the coefficient of thermal expansion (CTE) mismatch between the silicon substrate and the PWB laminate represents a potential fatigue problem because of the large MCM tile size or temperature change, it would be advantageous to use a low CTE alloy, such as Invar®. The space over and around the silicon substrate and between the walls of the PWB is also encompassed by highly compliant silicon gel 22. Cover 25 is large enough to permit enclosure of the ends of the MCM tile and of the interconnections by the silicone gel.

Figure 7:
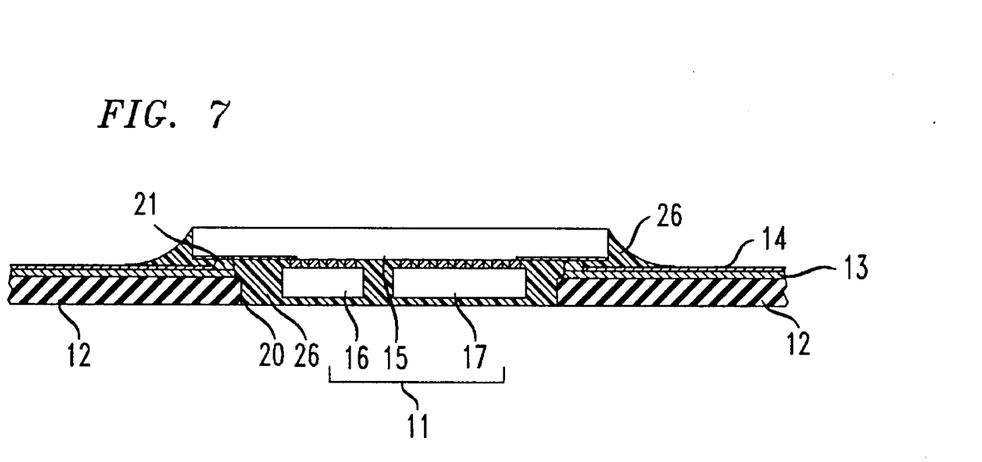
FIG. 7 is a schematic representation in cross-section of the semiconductor device shown in FIG. 1 but in which a cavity in the PWB is filled with a compliant encapsulating material encompassing the chips of the MCM tile and which material also at least partially encapsulates outer surfaces of the substrate of the MCM tile.

In FIG. 7 is shown an embodiment in which the cavity is filled by a different compliant encapsulating material, 26, such as an epoxy resin. This encapsulating material not only fills the cavity, but is also applied on top of the PWB adjacent the substrate and around the substrate. This encapsulating material is acting as a single material substitute for the silicon gel and for a glob top. The extent of coverage by the encapsulating material can be varied as needed.

Figure 8:
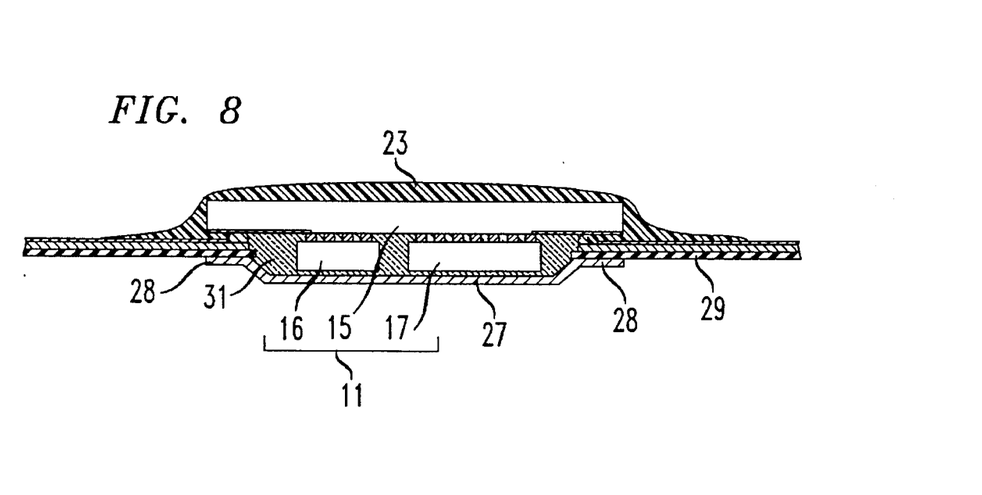
FIG. 8 is a schematic representation in cross-section of the semiconductor device shown in FIG. 1 but in which the PWB is a thin rigid board, a cup-like cover is on the chips side of the MCM tile, and a cavity, formed between the MCM tile substrate, the PWB and the cover, is filled with a compliant encapsulating material; a glob top may additionally protect the substrate.

The enclosure variants shown in FIGS. 3, 4, 5, 6 and 7 are well suited to rigid printed circuit boards. However, in some cases, the PWB may be rigid but is so thin that the chips or dies when placed within the aperture in the PWB shall project below the plane of the PWB so that the silicone gel shall not provide sufficient protection to the chips. To overcome this, a cup-like metal or plastic cover, 27, is placed on the chip side of the assembly as is shown in FIG. 8. Ends, 28, of the cover are positioned in contact with a thin PWB, 29, and juxtaposed to an area of interconnection between the MCM tile and the PWB providing additional rigidity to the interconnection area. The space bounded by cover 27 and silicon substrate 15 is filled with silicone gel 22. Optionally, glob top 23 may be placed over the silicon substrate to further protect the silicon substrate from the environment. Alternatively, metallized polymer film (not shown) similar to film 24 shown in FIG. 5 may be used instead of the glob top. Furthermore, encapsulating material 26 may be used instead of silicone gel 22 and placed about the MCM file in the manner shown in FIG. 7.

Figure 9:
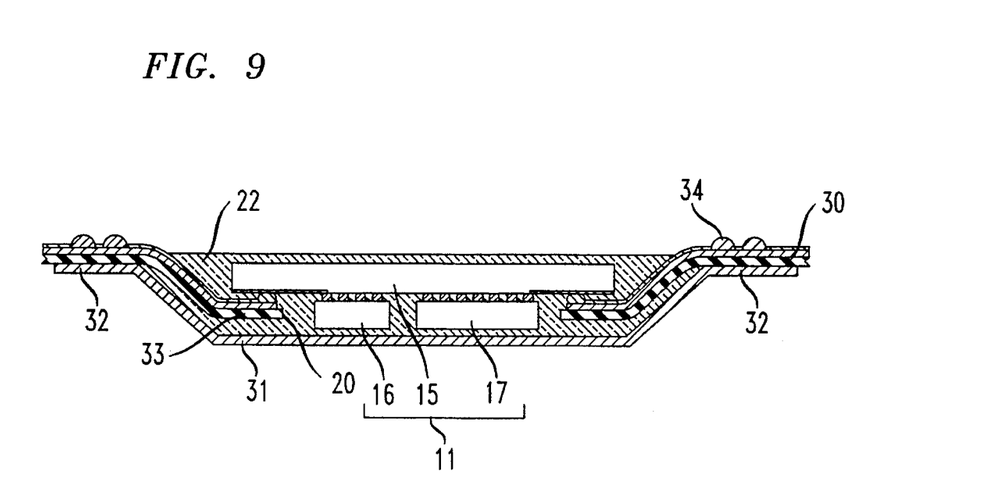
FIG. 9 is a schematic representation in cross-section of the semiconductor device shown in FIG. 1 but in which the PWB is a thin flexible board, the MCM tile is connected to portions of the PWB which are depressed relatively to the major plane of the PWB so that the MCM tile is offset relative to this plane, a cup-like cover is positioned on the depressed side of the PWB so as to protect the chips of the MCM tile protruding through the aperture and to support the planar portion of the board, and the whole of the MCM tile is enclosed in a compliant encapsulating material.

In FIG. 9 is shown another variant in which a PWB, 30, is not only thin but is also flexible. The circuitry on the PWB is interconnected to silicon substrate 15 via solder interconnections, while the chips project through aperture 20 beyond the PWB. To protect the chips from possible damage, a cup-like metal or plastic cover, 31, has peripheral edges, 73, which are connected adhesively to and locally support the planar portion of the PWB. To better accommodate the MCM tile within the protection by the cover, portions, 33, of the PWB defining aperture 20 are depressed into the cover so that the MCM tile and portions of the PWB are within the cavity formed by the cover. The MCM tile, portions 33 of the PWB and interconnections between the MCM tile and the PWB are additionally embedded in silicone gel 22. Optionally, solder bumps, 34, may be provided on PWB 30 for possible interconnection to a mother-board (not shown).

Figure 10:
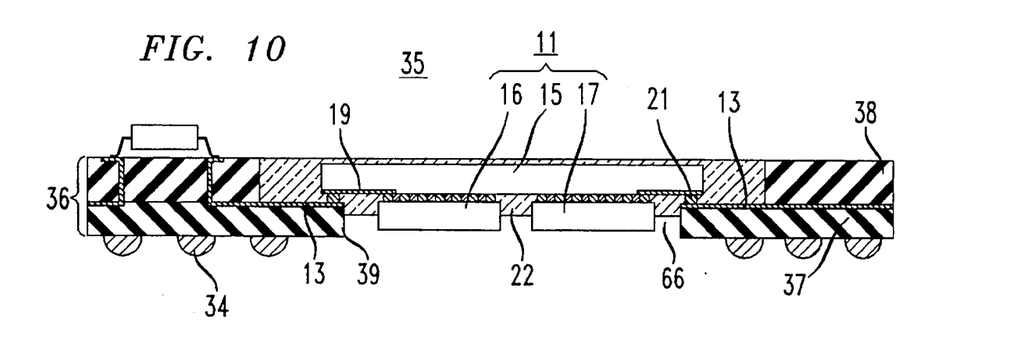
FIG. 10 is a schematic representation in cross-section of a semiconductor device in which a bi-level PWB is provided with a stepped through aperture, an MCM tile is mounted within a cavity formed by the stepped walls of the aperture, the MCM tile is electrically connected to the PWB by solder reflow or conductive adhesive interconnections, and the cavity is filled with the compliant encapsulating material encompassing the MCM tile.

In FIG. 10 is shown a schematic representation of an MCM package 35. The MCM package includes a bi-level PWB, 36, having a lower level, 37, and an upper level, 38. The PWB is provided with a stepped through-aperture, 39, the size of which is such that, when silicon substrate of the MCM tile is electrically interconnected to the PWB, ends of the silicon substrate overlay regions of the PWB adjacent the aperture in the lower level 37 of the PWB while chips on the silicon substrate face downward and fit into the aperture in the lower level without contacting the walls of the aperture. MCM tile 11 is positioned such that free surface of silicon substrate 15 of the MCM tile faces upwardly while chips 16 and 17 face downwardly through the aperture in the lower level and, yet, the chips are recessed within the aperture relative to the bottom surface of the lower level of the PWB. Bond fingers 19 on the silicon substrate are electrically connected to contacts, 13, on the PWB, by means of solder interconnections, 21. MCM tile is encapsulated with silicon gel 22 protectively enclosing interconnections between the chips and the silicon substrate and between the bond fingers on the silicon substrate and the contacts on the PWB. Since only the ends of the silicon MCM tile substrate are in contact with the circuitry on the PWB via solder interconnections and the chips are within the aperture, the thickness of the assembly is reduced to the thickness of the PWB. This compares favorably to the MCM tile-on-PWB assembly thickness that results with the MCM tile mounted on top of the PWB, oriented with the chips up, and wire bonded to the PWB circuitry as in the prior art exemplified by FIGS. 11 and 12.

Finally, if the PWB is to be an intermediate interconnection or a lead-frame board which is mounted to a mother-board (either a single-sided flexible PWB or a double-sided rigid PWB with plated thruholes), its metallizations should be patterned so as to mate with the mother-board through an I/O array of robustly solder printable bumped solder pads, such as bumps 34. Bumped solder pads are advantageous but pads without solder bumps are not excluded from this invention. Use of the 60 mil OMPAC standard BGA pitch would easily allow for a perimeter array of two staggered (for easy routing, even on an inexpensive single-sided PWB) rows of 0.71 mm (28 mil) diameter solder pads totaling 108 I/O in a 25.4 mm by 25.4 mm package. This provides the room needed for both (1) as many as 108 I/O connections and (2) the opening in the PWB for the MCM tile, without altering the shape or size of either the MCM package or the area on the mother-board required for the next level interconnection. At the same time it will still permit robust printed solder BGA bumping and surface mount reflow solder attachment to the mother-board. Bumps 34 are shown only on the PWB of FIGS. 9 and 10; however, these bumps may be provided on the PWBs in any of the variants shown in FIGS. 1 and 3–8.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A low profile multi-chip module (MCM) circuit arrangement which comprises an MCM tile and a printed wiring board (PWB), the MCM tile comprising a substrate and at least one silicon chip physically and electrically connected to the substrate, said PWB having an aperture through the PWB and contact fingers arranged peripherally of the aperture, the substrate of the MCM tile being larger than the aperture in the PWB, the MCM tile being positioned so that ends of the substrate overlap edges of the PWB adjacent the aperture while said at least one silicon chip is positioned within the aperture, and the substrate having peripheral metalizations which are physically and electrically interconnected to contact fingers on the PWB.

2. The MCM circuit arrangement of claim 1, in which a cavity formed by the substrate and walls of the aperture is filled with a highly conformable encapsulating material protectively enveloping interconnections between the substrate and said at least one silicon chip and between the substrate and the PWB.

3. The MCM circuit arrangement of claim 2, in which an outwardly facing surface of the substrate is protected by a "glob top".

4. The MCM circuit arrangement of claim 2 in which an outwardly facing surface of the substrate is protected by a metallized polymer film positioned about the substrate and to areas of the PWB adjacent the substrate.

5. The MCM circuit arrangement of claim 2 in which an outwardly facing surface of the substrate is protected by a cup-like cover positioned about the silicon substrate and secured to the PWB, the encapsulating material filling any space between the substrate and the cover.

6. The MCM circuit arrangement of claim 1, in which a cavity formed by the substrate and walls of the aperture is filled with a highly conformable encapsulating material protectively enveloping interconnections between the substrate and said at least one silicon chip and between the substrate and the PWB, said encapsulating material also at least partially encapsulates outer surfaces of the substrate acting as a "glob top".

7. The MCM circuit arrangement of claim 1, in which the PWB has a thin rigid form, a cup-like cover is positioned about the chip side of the MCM tile, and end flanges of the cover overlap and support the PWB at an area of the substrate-to-PWB interconnection.

8. The MCM circuit arrangement of claim 7, in which an outwardly facing surface of the substrate is enclosed by a "glob top".

9. The MCM circuit arrangement of claim 7, in which an outwardly facing surface of the substrate is enclosed by a metallized polymer film which overlaps areas of the PWB adjacent to the substrate.

10. The MCM circuit arrangement of claim 1, in which the PWB has a flexible form, a cup-like cover is positioned about the chip side of the MCM tile, portions of the PWB near the aperture are depressed into a cavity formed by the cover, and end flanges of the cover support areas of the PWB adjacent to said depressed portions.

11. The MCM circuit arrangement of claim 1, in which said PWB is a multilayer PWB, said aperture is a stepped-through aperture, the aperture through the upper level of the PWB being larger than the substrate and the aperture through the lower level of the PWB being smaller than the substrate of the MCM tile so that ends of the substrate overlap the edges of the lower level of the PWB while said at least one chip is positioned within the aperture in the lower level.

12. The MCM circuit arrangement of claim 1, in which said substrate comprises silicon.

13. The MCM circuit arrangement of claim 1, in which said at least one silicon chip is flip-chip mounted on the substrate.

14. The MCM circuit arrangement of claim 1, in which said at least one silicon chip is flip-chip mounted on the substrate by solder reflow technology.

15. The MCM circuit arrangement of claim 1, in which peripheral metallizations on the substrate are interconnected to the PWB by interconnect technology selected from the group consisting of solder reflow technology and conductive adhesive technology.

\* \* \* \* \*